(12) United States Patent
Lee et al.

(10) Patent No.: US 12,100,596 B2
(45) Date of Patent: Sep. 24, 2024

(54) METHODS OF MANUFACTURING SEMICONDUCTOR DEVICES

(71) Applicant: Samsung Electronics Co., Ltd., Suwon-si (KR)

(72) Inventors: Hyunki Lee, Suwon-si (KR); Duck-Nam Kim, Yongin-si (KR); Keunhee Bai, Suwon-si (KR); Sae Il Son, Suwon-si (KR); Kwang-Ho You, Hwaseong-si (KR); Cheolin Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 385 days.

(21) Appl. No.: 17/553,049

(22) Filed: Dec. 16, 2021

(65) Prior Publication Data
US 2022/0293426 A1 Sep. 15, 2022

(30) Foreign Application Priority Data
Mar. 15, 2021 (KR) ........................ 10-2021-0033509

(51) Int. Cl.
*H01L 21/308* (2006.01)
*H01L 21/027* (2006.01)
(Continued)

(52) U.S. Cl.
CPC ...... *H01L 21/3086* (2013.01); *H01L 21/0273* (2013.01); *H01L 21/31144* (2013.01); *H01L 21/76811* (2013.01)

(58) Field of Classification Search
CPC ............. H01L 21/3086; H01L 21/0273; H01L 21/31144; H01L 21/76811; H01L 21/0337; H01L 21/76816; H01L 23/485; H01L 21/76802; H01L 21/76877; H01L 21/76883; H01L 21/31116; H01L 21/823475; H01L 27/088; H01L 29/0673; H01L 29/42392; H01L 21/02642; H01L 21/027; H01L 21/0332; H01L 21/0465; H01L 21/266
See application file for complete search history.

(56) References Cited

U.S. PATENT DOCUMENTS 8,954,913 B1 2/2015 Yuan et al.
9,941,154 B2 4/2018 Song et al.
(Continued)

FOREIGN PATENT DOCUMENTS

KR 20180033989 A 4/2018

*Primary Examiner* — Mohammad A Rahman
(74) *Attorney, Agent, or Firm* — Myers Bigel, P.A.

(57) ABSTRACT

A method of manufacturing a semiconductor device includes forming an interlayer insulating layer on a substrate, forming a first mask layer on the interlayer insulating layer, forming a second mask layer and a first spacer on the first mask layer, forming a photoresist pattern on the second mask layer, forming a second mask pattern by patterning the second mask layer through a first etching process, forming a first mask pattern by patterning the first mask layer through a second etching process, forming a trench by etching a portion of the interlayer insulating layer through a third etching process, and forming an interconnection pattern within the trench. A width of the first mask pattern after the second etching process is less than a width of the photoresist pattern.

20 Claims, 13 Drawing Sheets

(51) Int. Cl.
    *H01L 21/311*     (2006.01)
    *H01L 21/768*     (2006.01)

(56) References Cited

U.S. PATENT DOCUMENTS

| | | |
|---|---|---|
| 10,026,614 B2 | 7/2018 | Yoon et al. |
| 10,170,306 B2 | 1/2019 | Lee et al. |
| 10,347,506 B2 | 7/2019 | Fan et al. |
| 10,755,969 B2 | 8/2020 | Chu et al. |
| 2011/0183505 A1* | 7/2011 | Min .................. H01L 21/76816 438/586 |

* cited by examiner

METHODS OF MANUFACTURING SEMICONDUCTOR DEVICES

CROSS-REFERENCE TO RELATED APPLICATION

This U.S. non-provisional patent application claims priority under 35 U.S.C. § 119 to Korean Patent Application No. 10-2021-0033509, filed on Mar. 15, 2021, in the Korean Intellectual Property Office, the disclosure of which is hereby incorporated by reference in its entirety.

TECHNICAL FIELD

Embodiments of the inventive concepts relate to semiconductor devices and to methods of manufacturing the same, and more particularly, to semiconductor devices including interconnection patterns having widths thereof changed in stages and to methods of manufacturing the same.

BACKGROUND

As semiconductor devices have become increasingly integrated, metal-oxide-semiconductor (MOS) field-effect-transistors, or MOSFETs, have been scaled down rapidly. However, resistances of interconnection lines and a capacitance between the interconnection lines may be increased by reductions in one or more critical dimensions (CD), and thus it may be difficult to operate increasingly integrated semiconductor devices at high speed. Accordingly, various methods have been studied and are under study for forming semiconductor devices which have improved or excellent performance while concurrently overcoming limitations resulting from increased integration.

SUMMARY

Embodiments of the inventive concepts may provide semiconductor devices and methods of manufacturing the same. Semiconductor devices according to the present disclosure may exhibit improved electrical characteristics, and manufacturing processes according to the methods described herein may be simplified as compared to the related art.

In an aspect, a method of manufacturing a semiconductor device may include forming an interlayer insulating layer on a substrate, forming a first mask layer on the interlayer insulating layer, forming a second mask layer and a first spacer that covers a first sidewall of the second mask layer on the first mask layer, forming a photoresist pattern on the second mask layer, forming a second mask pattern by patterning the second mask layer through a first etching process that uses the photoresist pattern as an etch mask, forming a first mask pattern by patterning the first mask layer through a second etching process that uses the second mask pattern and the first spacer as etch masks, forming a trench by etching a portion of the interlayer insulating layer through a third etching process that uses the first mask pattern as an etch mask, and forming an interconnection pattern within the trench. A width of the first mask pattern after the second etching process may be less than a width of the photoresist pattern.

In an aspect, a method of manufacturing a semiconductor device may include forming an interlayer insulating layer on a substrate, forming a mask layer and a first spacer that covers a first sidewall of the mask layer on the interlayer insulating layer, forming a photoresist pattern on the mask layer, forming a mask pattern by patterning the mask layer through a first etching process that uses the photoresist pattern as an etch mask, forming a trench by etching a portion of the interlayer insulating layer through a second etching process that uses the mask pattern and the first spacer as etch masks, and forming an interconnection pattern within the trench. A first width defined as a distance between the mask pattern and the first spacer may be based on a width of the photoresist pattern.

In an aspect, a method of manufacturing a semiconductor device may include forming standard cells which comprise a substrate comprising active patterns that extend in a first direction, gate structures and active contacts that intersect the active patterns on the substrate, and an interlayer insulating layer that covers the gate structures and the active contacts, and forming an interconnection pattern that extends in the first direction between the standard cells and is electrically connected to the gate structure or the active contact. The forming of the interconnection pattern may include forming a first mask layer on the interlayer insulating layer, forming a second mask layer and a first spacer that covers a first sidewall of the second mask layer on the first mask layer, forming a photoresist pattern on the second mask layer, forming a second mask pattern by patterning the second mask layer through a first etching process that uses the photoresist pattern as an etch mask, forming a first mask pattern by patterning the first mask layer through a second etching process that uses the second mask pattern and the first spacer as etch masks, forming a trench by etching a portion of the interlayer insulating layer through a third etching process that uses the first mask pattern as an etch mask, forming a metal layer within the trench, and performing a planarization process on the metal layer until a top surface of the interlayer insulating layer is exposed. A width of the first mask pattern after the second etching process may be less than a width of the photoresist pattern.

BRIEF DESCRIPTION OF THE DRAWINGS

The inventive concepts will become more apparent in view of the attached drawings and accompanying detailed description.

DETAILED DESCRIPTION OF THE EMBODIMENTS

A semiconductor device and a method of manufacturing the same according to some embodiments of the inventive concepts will be described more fully hereinafter with reference to the accompanying drawings.

Figure 1:
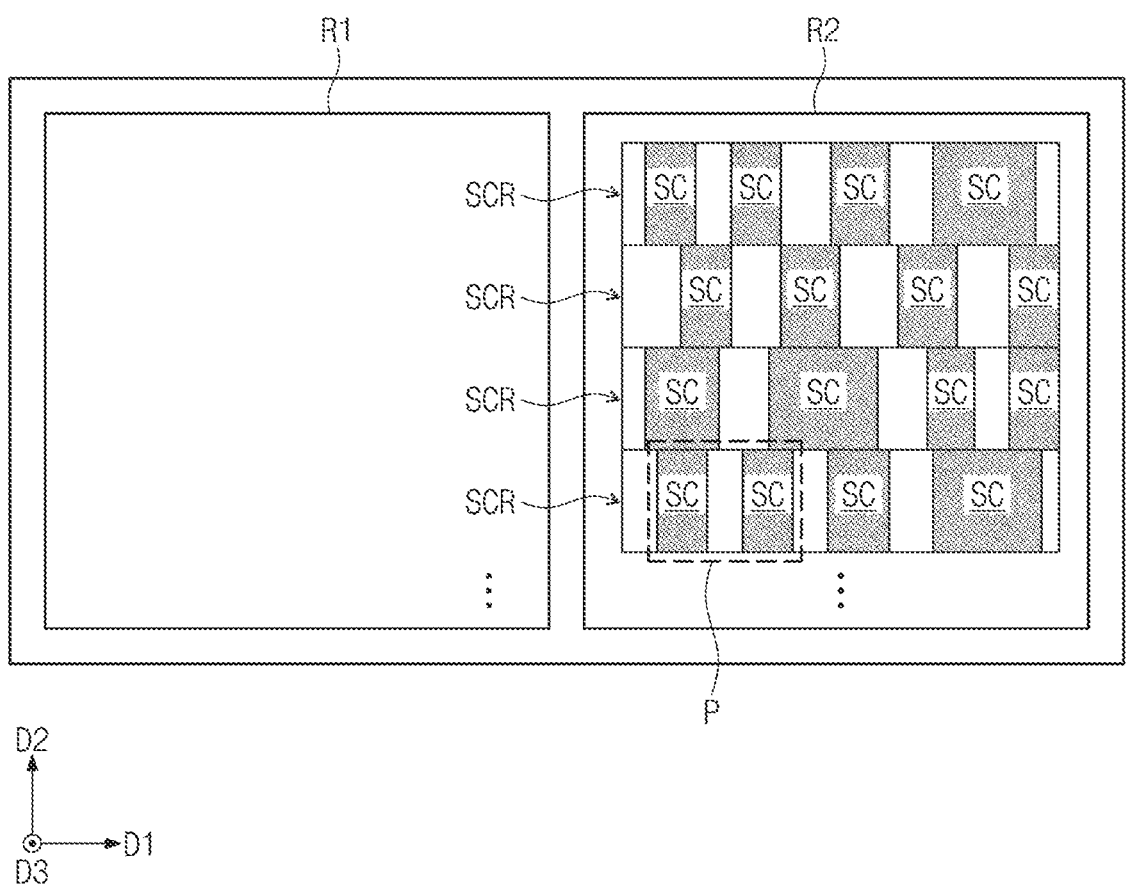
FIG. 1 is a conceptual view illustrating a semiconductor device according to some embodiments of the inventive concepts.

FIG. 1 is a conceptual view illustrating a semiconductor device according to some embodiments of the inventive concepts.

Referring to FIG. 1, a semiconductor device according to the inventive concepts may include a first region R1 and a second region R2. The first region R1 may be, for example, a cell array region including cell arrays (not shown). Each of the cell arrays of the first region R1 may include a plurality of memory cells, bit lines, and word lines (not shown in FIG. 1). The bit lines and the word lines may be electrically connected to the memory cells.

The second region R2 may be, for example, a peripheral circuit region including peripheral circuits. For example, the peripheral circuits of the second region R2 may control read, write and/or erase operations of the memory cells of the first region R1 in response to control signals. For example, the peripheral circuits of the second region R2 may include various logic circuits such as one or more AND circuits, OR circuits, NAND circuits, NOR circuits, inverters (INV), flip-flop circuits, and/or latch circuits.

The peripheral circuits of the second region R2 may be arranged in a plurality of standard cell rows SCR. Each of the standard cell rows SCR may include a plurality of standard cells SC. In each of the standard cell rows SCR, the standard cells SC may be designed using a cell library that includes data for realizing a specific logic element or logic elements. Each of the standard cells SC may include logic circuits such as AND circuits, OR circuits, NAND circuits, NOR circuits, and/or inverters (INV), as examples. In addition, the various standard cells SC may be combined with each other to constitute a single functional circuit. In some embodiments, the standard cells SC may have various sizes depending on their functions.

The standard cells SC of a standard cell row SCR may be arranged in a first direction D1. The standard cells SC may have the same unit length in a second direction D2, but widths of the standard cells SC in the first direction D1 may be different from each other depending on their functions. The unit length of each of the standard cells SC may be determined depending on a size of an NMOS transistor and/or a PMOS transistor included in each of the standard cells SC and/or a critical dimension (CD) of interconnection lines included in each of the standard cells SC. The standard cell rows SCR may be arranged in the second direction D2 and may extend in parallel in the first direction D1.

In some embodiments, the first region R1 and the second region R2 may be adjacent to each other in the first direction D1, as seen in FIG. 1. However, embodiments of the inventive concepts are not limited thereto. In some embodiments, the first region R1 and the second region R2 may be stacked in a third direction D3. In other words, one of the first region R1 and the second region R2 may overlap the other. In some embodiments, various components may be provided between the first region R1 and the second region R2 or around the first region R1 and/or the second region R2. For example, a decoder circuit for selecting a bit line among the bit lines of the first region R1 and/or a word line among the word lines of the first region R1 may be provided. The decoder circuit may be configured to decode an address signal inputted from an external source. Another example of a component provided between or around the first and second regions R1 and R2 may be a page buffer for sensing data stored in the memory cells.

Figure 2:
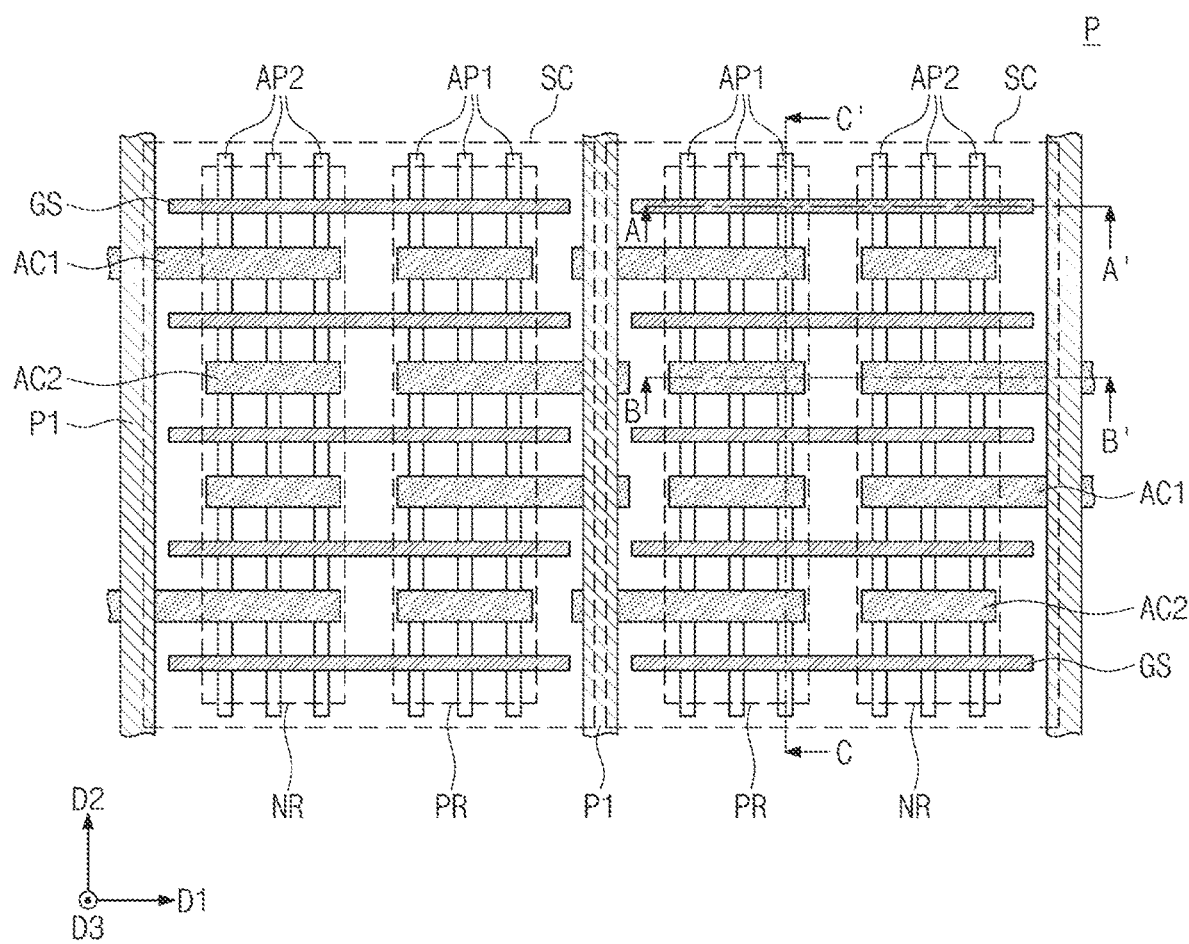
FIG. 2 is a plan view corresponding to a portion 'P' of FIG. 1 to illustrate a semiconductor device according to some embodiments of the inventive concepts.
Figure 3A:
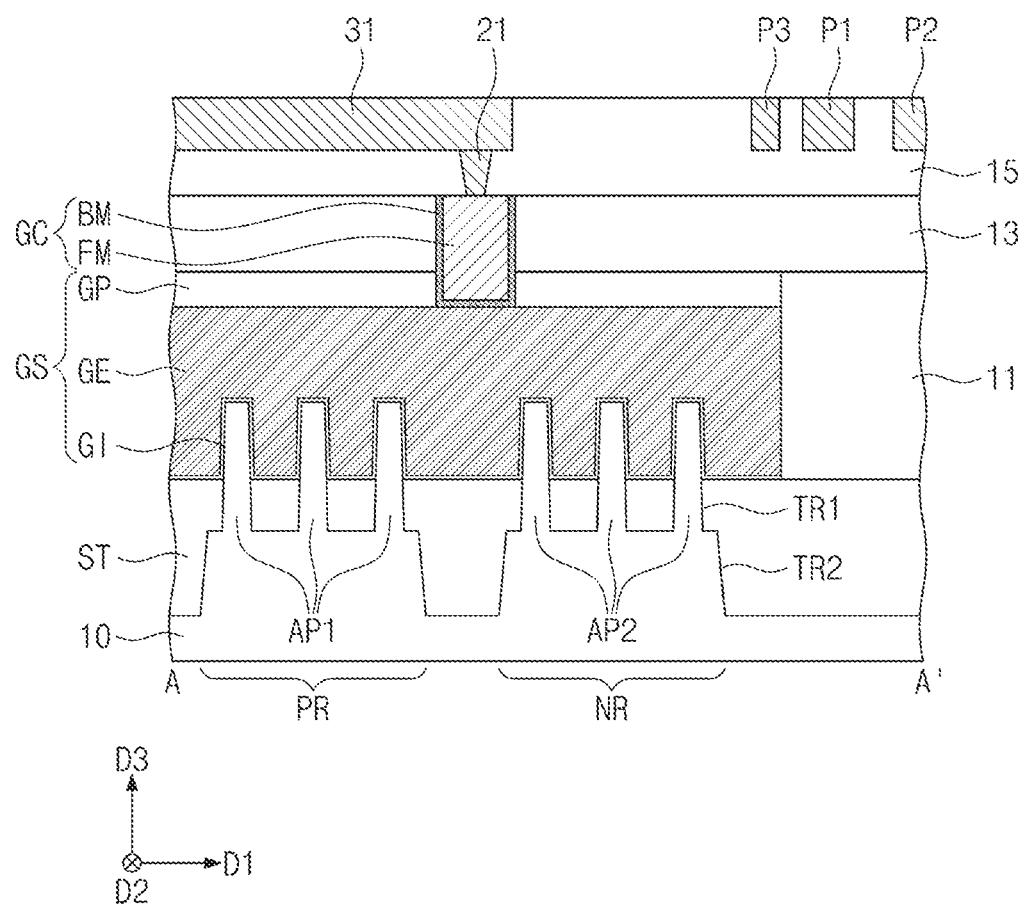
FIGS. 3A, 3B and 3C are cross-sectional views taken along lines A-A', B-B' and C-C' of FIG. 2, respectively, to illustrate a semiconductor device according to some embodiments of the inventive concepts.
Figure 3B:
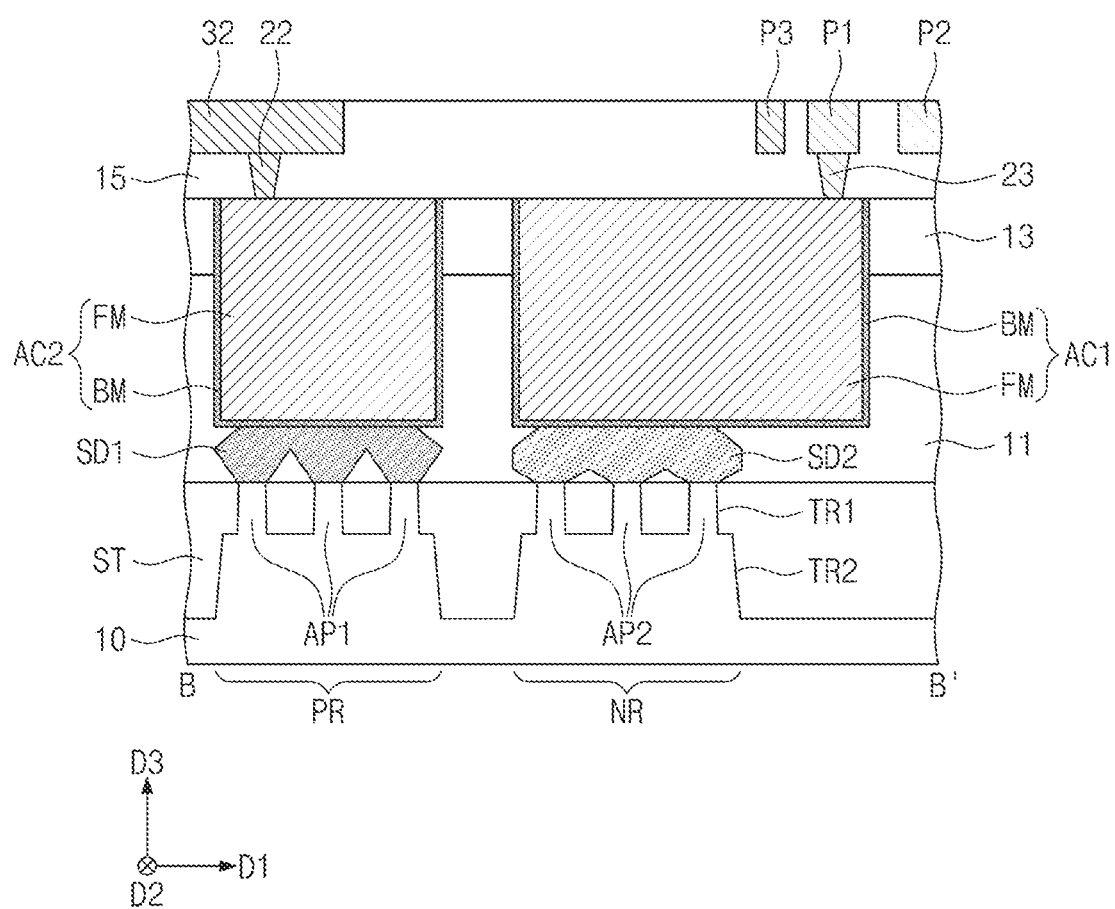
Figure 3C:
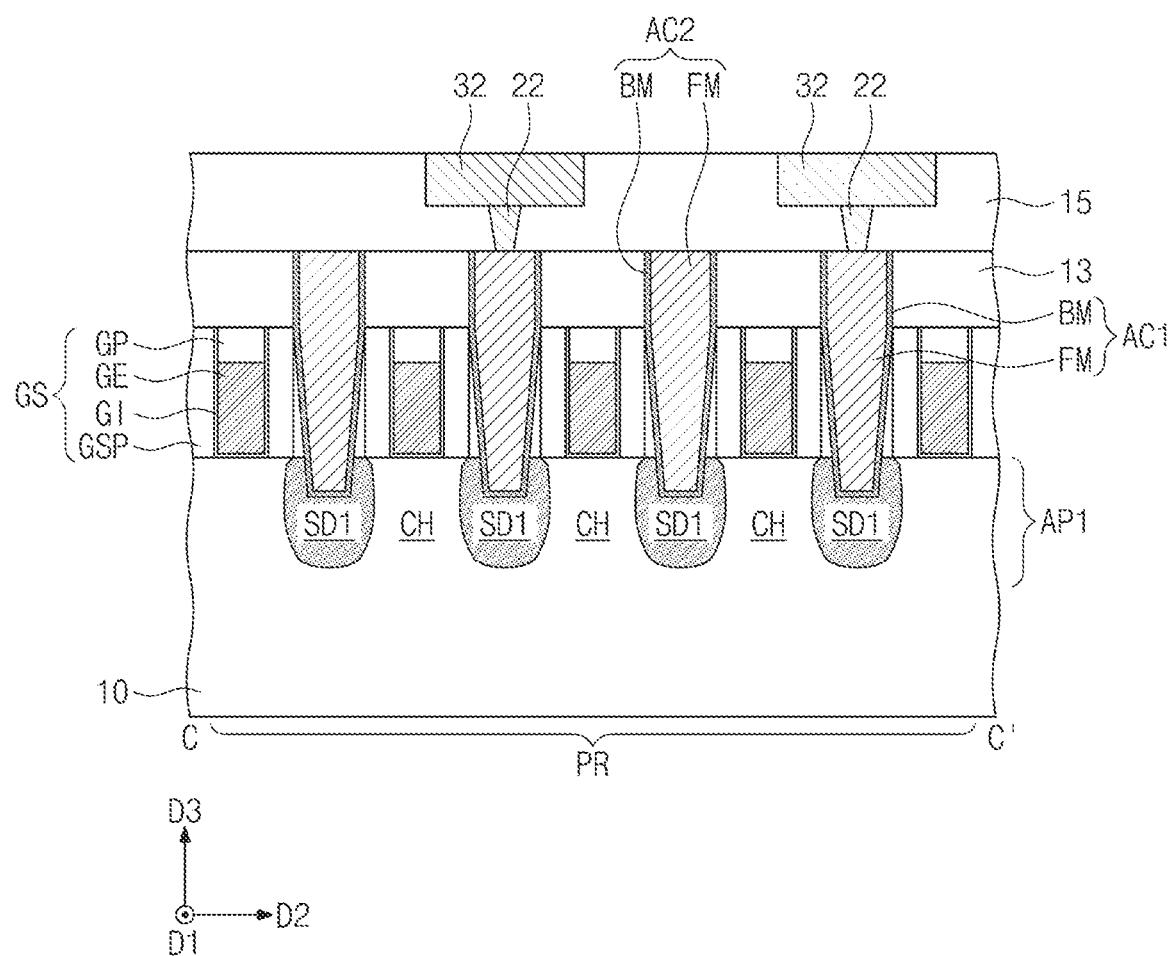

FIG. 2 is a plan view corresponding to a portion 'P' of FIG. 1 to illustrate a semiconductor device according to some embodiments of the inventive concepts. FIGS. 3A, 3B and 3C are cross-sectional views taken along lines A-A', B-B' and C-C' of FIG. 2, respectively, to illustrate a semiconductor device according to some embodiments of the inventive concepts.

Referring to FIGS. 2, 3A, 3B and 3C, each of the standard cells SC may include a substrate 10, a gate structure GS on the substrate 10, and first and second active contacts AC1 and AC2. A first interconnection pattern P1 may be provided between the standard cells SC. The first interconnection pattern P1 may be electrically connected to the standard cells SC adjacent thereto. For example, the first interconnection pattern P1 may be a power rail to which a power voltage or a ground voltage is applied. Hereinafter, a single standard cell SC will be described for the purpose of ease and convenience in explanation. However, the following descriptions may be similarly applied to other standard cells SC.

In the standard cell SC, the substrate 10 may include a first cell region PR and a second cell region NR. In some embodiments, the substrate 10 may be a semiconductor substrate including silicon (Si), germanium (Ge), or silicon-germanium (SiGe), or the substrate 10 may be a compound semiconductor substrate. In some embodiments, the substrate 10 may be a silicon substrate. A top surface of the substrate 10 may be parallel to a first direction D1 and a second direction D2 and may be perpendicular to a third direction D3. The first direction D1, the second direction D2 and the third direction D3 may be perpendicular to each other.

The first cell region PR and the second cell region NR may be defined by a second trench TR2 formed in an upper portion of the substrate 10. The second trench TR2 may be between the first cell region PR and the second cell region NR. As seen in FIGS. 3A and 3B, the first cell region PR and the second cell region NR may be spaced apart from each other in the first direction D1 with the second trench TR2 interposed therebetween.

The first cell region PR and the second cell region NR may be regions on which transistors constituting a logic circuit are provided. For example, the first cell region PR may be a region on which PMOS field effect transistors are provided, and the second cell region NR may be a region on which NMOS field effect transistors are provided.

A first active pattern AP1 and a second active pattern AP2 may be defined by a first trench TR1 formed in the upper portion of the substrate 10. The first active pattern AP1 and the second active pattern AP2 may be provided on the first cell region PR and the second cell region NR, respectively. The first trench TR1 may be shallower than the second trench TR2. Stated differently, a depth in the third direction D3 of the first trench TR1 may be less than a depth in the third direction D3 of the second trench TR2. The first and second active patterns AP1 and AP2 may extend in the second direction D2 and may be spaced apart from each other in the first direction D1. A width of each of the first and second active patterns AP1 and AP2 in the first direction D1 may decrease as a height in the third direction D3 increases.

The first and second active patterns AP1 and AP2 may be portions of the substrate 10 that protrude in the third direction D3. In other words, each of upper portions of the first and second active patterns AP1 and AP2 may have a single fin shape protruding above a device isolation layer ST. The fin shape protruding above the device isolation layer ST may be provided between first source/drain patterns SD1 or between second source/drain patterns SD2. The inside of the fin shape may be referred to as a channel layer CH. In other words, each of the transistors of the first and second cell regions PR and NR may be a fin field effect transistor (Fin-FET).

The device isolation layer ST may fill the first and second trenches TR1 and TR2. In some embodiments, the device isolation layer ST may include silicon oxide. The device isolation layer ST may not cover upper portions of each of the first and second active patterns AP1 and AP2. The device isolation layer ST may cover a portion of a sidewall of each of the first and second active patterns AP1 and AP2.

A pair of first source/drain patterns SD1 may be provided in the upper portion of the first active pattern AP1. For example, the first source/drain patterns SD1 may be dopant regions having a first conductivity type (e.g., a P-type). The channel layer CH may be provided between the pair of first source/drain patterns SD1.

A pair of second source/drain patterns SD2 may be provided in the upper portion of the second active pattern AP2. For example, the second source/drain patterns SD2 may be dopant regions having a second conductivity type (e.g., an N-type). The channel layer CH may be provided between the pair of second source/drain patterns SD2.

In some embodiments, the first and second source/drain patterns SD1 and SD2 may include epitaxial patterns formed by a selective epitaxial growth (SEG) process. For example, a top surface of each of the first and second source/drain patterns SD1 and SD2 may be located at substantially the same level as a top surface of the channel layer CH. However, embodiments of the inventive concepts are not limited thereto. In some embodiments, the top surface of each of the first and second source/drain patterns SD1 and SD2 may be located at a higher level than the top surface of the channel layer CH.

The first source/drain patterns SD1 may include a semiconductor material (e.g., SiGe) of which a lattice constant is greater than that of a semiconductor material of the substrate 10. Thus, the first source/drain patterns SD1 may provide compressive stress to the channel layer CH. The second source/drain patterns SD2 may include the same semiconductor material (e.g., silicon) as the substrate 10.

The gate structure GS may extend in the first direction D1 to intersect the first and second active patterns AP1 and AP2. A portion of the gate structure GS may overlap with the channel layer CH in the third direction D3, as best seen in FIG. 3C. The gate structure GS may include a gate electrode GE, a gate capping pattern GP, a gate spacer GSP, and a gate insulating layer GI.

The gate electrode GE may include a first metal pattern and a second metal pattern on the first metal pattern. The first metal pattern may be provided on the gate insulating layer GI and may be adjacent to the channel layer CH. The first metal pattern may include a work function metal for adjusting a threshold voltage of the transistor. A desired threshold voltage of the transistor may be obtained by adjusting a thickness and a composition of the first metal pattern.

The first metal pattern may include metal nitride. For example, the first metal pattern may include nitrogen (N) and at least one metal selected from a group consisting of titanium (Ti), tantalum (Ta), aluminum (Al), tungsten (W), and molybdenum (Mo). In addition, the first metal pattern may further include carbon (C). In some embodiments, the first metal pattern may include a plurality of stacked work function metal layers.

The second metal pattern may include a metal having a resistance lower than that of the first metal pattern. For example, the second metal pattern may include at least one metal selected from a group consisting of tungsten (W), aluminum (Al), titanium (Ti), and tantalum (Ta).

The gate capping pattern GP may be provided on the gate electrode GE. The gate capping pattern GP may extend along the gate electrode GE in the first direction D1. The gate capping pattern GP may include a material having an etch selectivity with respect to interlayer insulating layers to be described later in greater detail. For example, the gate capping pattern GP may include at least one of SiON, SiCN, SiCON, or SiN.

The gate spacer GSP may be provided to cover a sidewall of the gate electrode GE. The gate spacer GSP may extend along the gate electrode GE in the first direction D1 on both sides of the gate electrode GE. A top surface of the gate spacer GSP may be located at a higher level than a top surface of the gate electrode GE. In other words, the top surface of the gate spacer GSP may be farther from the substrate 10 than the top surface of the gate electrode GE is from the substrate 10. The top surface of the gate spacer GSP may be substantially coplanar with a top surface of the gate capping pattern GP. The gate spacer GSP may include at least one of SiCN, SiCON, or SiN. In some embodiments, the gate spacer GSP may have a multi-layered structure formed of at least two of SiCN, SiCON, or SiN.

The gate insulating layer GI may be provided between a bottom surface of the gate electrode GE and the channel layer CH and between a sidewall of the gate electrode GE and the gate spacer GSP. The gate insulating layer GI may extend along the bottom surface of the gate electrode GE in the first direction D1. The gate insulating layer GI may cover a top surface of the device isolation layer ST under the gate electrode GE. The gate insulating layer GI may extend between the gate electrode GE and the gate spacer GSP. The gate insulating layer GI may include a gate oxide layer and a high-k dielectric layer. The gate oxide layer may be provided between the high-k dielectric layer and the channel layer CH and between the high-k dielectric layer and the gate spacer GSP.

In some embodiments, the gate oxide layer may include silicon oxide or silicon oxynitride. For example, the gate oxide layer may include silicon oxide. The high-k dielectric layer may include a high-k dielectric material of which a dielectric constant is higher than those of silicon oxide and silicon nitride. For example, the high-k dielectric layer may include at least one of hafnium oxide, hafnium-silicon oxide, hafnium-zirconium oxide, hafnium-tantalum oxide, lanthanum oxide, zirconium oxide, zirconium-silicon oxide, tantalum oxide, titanium oxide, barium-strontium-titanium oxide, barium-titanium oxide, strontium-titanium oxide, lithium oxide, aluminum oxide, lead-scandium-tantalum oxide, and/or lead-zinc niobate.

A first interlayer insulating layer 11 may be provided on the substrate 10. The first interlayer insulating layer 11 may cover the top surface of the device isolation layer ST, sidewalls of the first and second source/drain patterns SD1 and SD2, a sidewall of the gate spacer GSP, and a portion of a sidewall of each of the first and second active contacts AC1 and AC2 to be described later in greater detail. A top surface of the first interlayer insulating layer 11 may be substantially coplanar with the top surface of the gate capping pattern GP and the top surface of the gate spacer GSP. A second interlayer insulating layer 13 may be provided on the first interlayer insulating layer 11 to cover the top surface of the gate capping pattern GP and the top surface of the gate spacer GSP. The second interlayer insulating layer 13 may cover a remaining portion of the sidewall of each of the first and second active contacts AC1 and AC2 to be described later in greater detail. The first and second interlayer insulating layers 11 and 13 may include an insulating material such as an oxide. For example, the first and second interlayer insulating layers 11 and 13 may include silicon oxide.

The first and second active contacts AC1 and AC2 may penetrate the second and first interlayer insulating layers 13 and 11 and may be electrically connected to the first and second source/drain patterns SD1 and SD2. The first and second active contacts AC1 and AC2 may be provided at both sides of the gate electrode GE, respectively. Each of the first and second active contacts AC1 and AC2 may have a bar shape extending in the first direction D1 when viewed in a plan view. As best seen in FIG. 2, a length of the first active contact AC1 in the first direction D1 may be greater than a length of the second active contact AC2 in the first direction D1. The first active contact AC1 may extend in the first direction D1 to overlap with a portion of the first interconnection pattern P1 in the third direction D3. The second active contact AC2 may be free of overlap with a portion of the first interconnection pattern P1 in the third direction D3.

Each of the first and second active contacts AC1 and AC2 may include a conductive pattern FM and a barrier pattern BM surrounding or substantially surrounding the conductive pattern FM. For example, the conductive pattern FM may include at least one metal of aluminum, copper, tungsten, molybdenum, or cobalt. The barrier pattern BM may cover a bottom surface and a sidewall of the conductive pattern FM. An upper surface of the conductive pattern FM may be free of coverage by the barrier pattern BM. The barrier pattern BM may include a metal layer and/or a metal nitride layer. The metal layer may include at least one of titanium, tantalum, tungsten, nickel, cobalt, or platinum. The metal nitride layer may include at least one of titanium nitride (TiN), tantalum nitride (TaN), tungsten nitride (WN), nickel nitride (NiN), cobalt nitride (CoN), or platinum nitride (PtN).

The first and second active contacts AC1 and AC2 may be self-aligned contacts. In other words, the first and second active contacts AC1 and AC2 may be self-aligned using the gate capping pattern GP and the gate spacer GSP. For example, each of the first and second active contacts AC1 and AC2 may cover at least a portion of the sidewall of the gate spacer GSP. In some embodiments, and in contrast to FIG. 3C, each of the first and second active contacts AC1 and AC2 may also cover a portion of the top surface of the gate capping pattern GP.

In some embodiments, a silicide pattern (not shown) may be provided between each of the first and second active contacts AC1 and AC2 and each of the first and second source/drain patterns SD1 and SD2. Each of the first and second active contacts AC1 and AC2 may be electrically connected to one of the first and second source/drain patterns SD1 and SD2 through the silicide pattern. The silicide pattern may include a metal silicide. For example, the silicide pattern may include at least one of titanium silicide, tantalum silicide, tungsten silicide, nickel silicide, or cobalt silicide.

A gate contact GC may penetrate the second interlayer insulating layer 13 and the gate capping pattern GP and may be electrically connected to the gate electrode GE. For example, the gate contact GC may be provided over the device isolation layer ST between the first cell region PR and the second cell region NR. The gate contact GC may have a bar shape that extends in the second direction D2 when viewed in a plan view. Like the first and second active contacts AC1 and AC2, the gate contact GC may include a conductive pattern FM and a barrier pattern BM that surrounds the conductive pattern FM.

A third interlayer insulating layer 15 may be provided on the second interlayer insulating layer 13. The first interconnection pattern P1, a second interconnection pattern P2, a third interconnection pattern P3, a fourth interconnection pattern 31 and a fifth interconnection pattern 32 may be provided in the third interlayer insulating layer 15. For example, the first to third interconnection patterns P1, P2 and P3 may be located at substantially the same level as the fourth and fifth interconnection patterns 31 and 32. A first via 23 connected to the first interconnection pattern P1 may be provided in the third interlayer insulating layer 15. A second via 21 connected to the fourth interconnection pattern 31 may be provided in the third interlayer insulating layer 15. A third via 22 connected to the fifth interconnection pattern 32 may be provided in the third interlayer insulating layer 15.

The first interconnection pattern P1 may extend in the second direction D2 between the standard cells SC. A width of the first interconnection pattern P1 in the first direction D1 may not be uniform. For example, the width of the first interconnection pattern P1 in the first direction D1 may vary at different positions thereof, as described later in a method of manufacturing a semiconductor device according to some embodiments of the inventive concepts. A resistance value of the first interconnection pattern P1 may be targeted by adjusting the width of the first interconnection pattern P1 in the first direction D1, and thus stability and electrical characteristics of the semiconductor device according to the inventive concepts may be improved.

The second and third interconnection patterns P2 and P3 may be arranged at both sides of the first interconnection pattern P1, respectively, and may extend along the first interconnection pattern P1 in the second direction D2. A width of each of the second and third interconnection patterns P2 and P3 in the first direction D1 may be different from the width of the first interconnection pattern P1 in the first direction D1. For example, the width of each of the second and third interconnection patterns P2 and P3 in the first direction D1 may be less than the width of the first interconnection pattern P1 in the first direction D1, as seen in FIG. 3B. For example, the first interconnection pattern P1 may be electrically connected to the first active contact AC1 through the first via 23. However, in some embodiments and in contrast to FIG. 3B, the first interconnection pattern P1 may be connected to the gate contact GC through the first via 23 or may be connected directly to the gate structure GS.

As an example, the fourth interconnection pattern 31 may extend in the first direction D1 and may be electrically connected to the gate contact GC through the second via 21. As an example, the fifth interconnection pattern 32 may extend in the first direction D1 and may be electrically connected to the second active contact AC2 through the third via 22. However, embodiments of the inventive concepts are not limited thereto. Each of the fourth and fifth interconnection patterns 31 and 32 may have at least one of various shapes extending in the first direction D1 and/or the second direction D2 when viewed in a plan view.

The first interconnection pattern P1 and the first via 23; the fourth interconnection pattern 31 and the second via 21; and/or the fifth interconnection pattern 32 and the third via 22 may be connected to each other in one body to constitute a single conductive structure. In other words, in some embodiments they may be formed as a single conductive structure by a damascene process. In some embodiments, the first to fifth interconnection patterns P1, P2, P3, 31 and 32 and the first to third vias 23, 21 and 22 may include at least one metal of aluminum, copper, tungsten, molybdenum, or cobalt.

Although not shown in the drawings, metal layers (e.g., M2, M3, M4, etc.) may be additionally stacked on the third interlayer insulating layer 15, and the first to third interconnection patterns P1, P2 and P3 may be located at the same level as one of the metal layers on the third interlayer insulating layer 15.

Figure 4A:
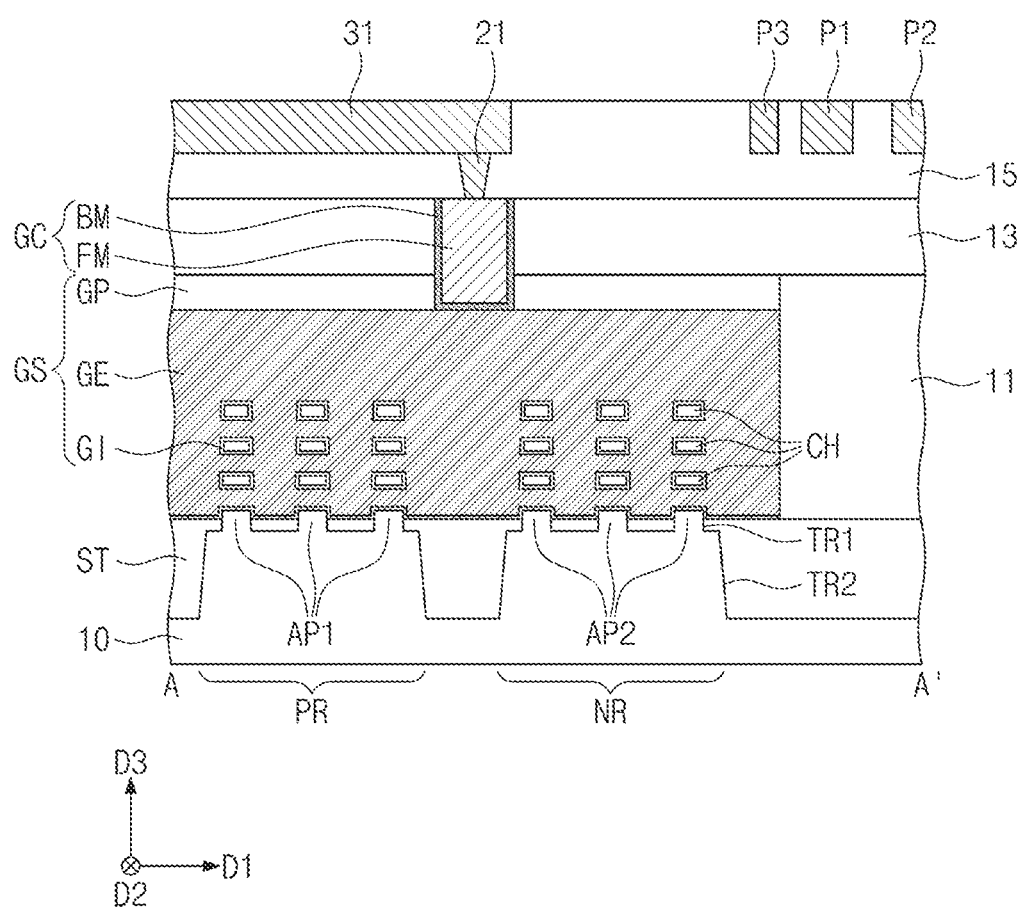
FIGS. 4A and 4B are cross-sectional views taken along the lines A-A' and C-C' of FIG. 2, respectively, to illustrate a semiconductor device according to some embodiments of the inventive concepts.
Figure 4B:
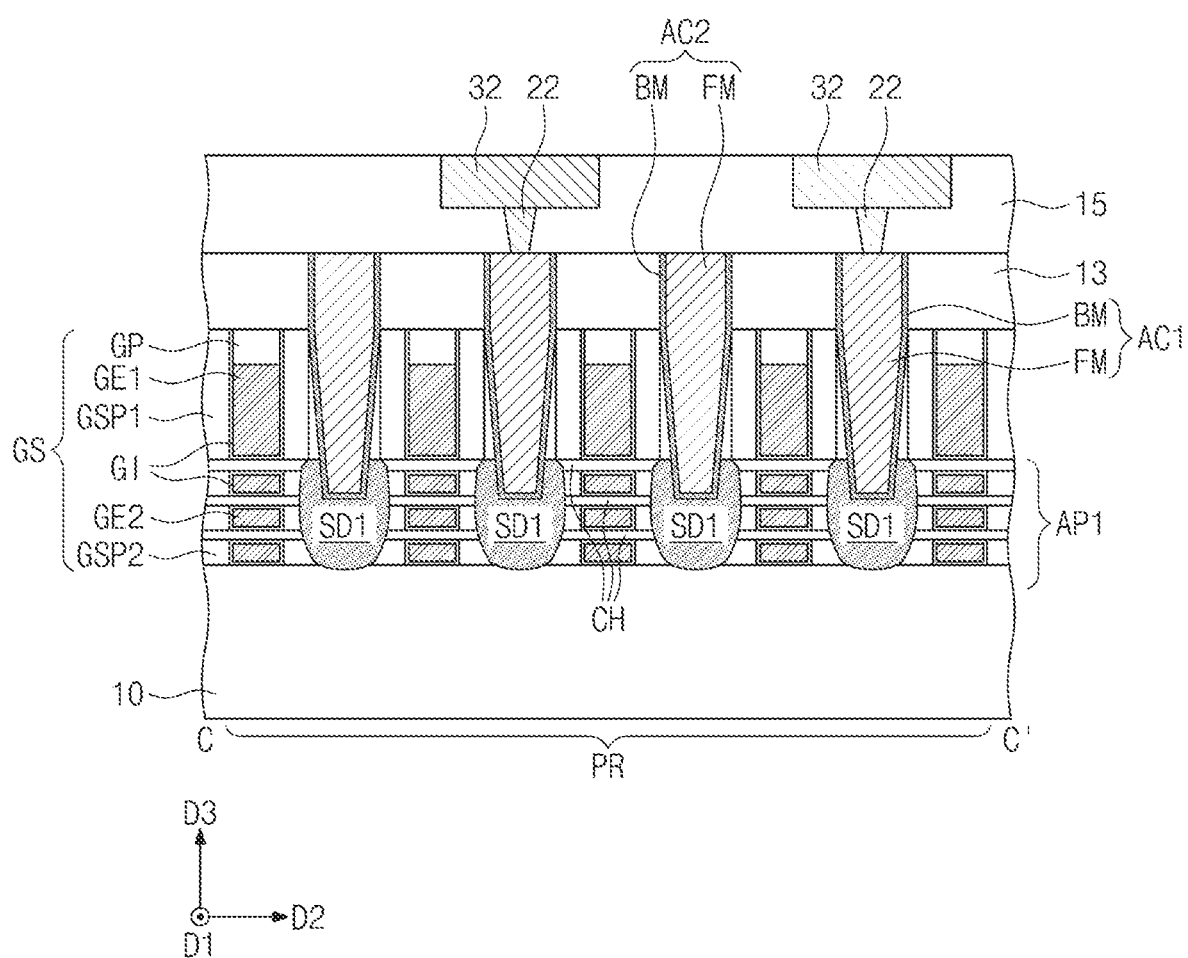

FIGS. 4A and 4B are cross-sectional views taken along the lines A-A' and C-C' of FIG. 2, respectively, to illustrate a semiconductor device according to some embodiments of the inventive concepts. Hereinafter, descriptions of the same technical features as in the embodiments of FIGS. 2 and 3A to 3C will be omitted for the purpose of ease and convenience in explanation. In other words, only differences between the present embodiments and the embodiments of FIGS. 2 and 3A to 3C will be mainly described.

Referring to FIGS. 2, 4A and 4B, each of first and second active patterns AP1 and AP2 may include a plurality of stacked channel layers CH. A gate electrode GE may surround each of the channel layers CH.

The gate electrode GE may include a first portion GE1 provided on a top surface of each of the first and second active patterns AP1 and AP2, and a second portion GE2 provided between the first source/drain patterns SD1 (or between the second source/drain patterns SD2). The first portion GE1 of the gate electrode GE may be located at a higher level than the top surface of each of the first and second active patterns AP1 and AP2 and the top surface of each of the first and second source/drain patterns SD1 and SD2. The second portion GE2 of the gate electrode GE may extend in the first direction D1 between the channel layers CH in parallel to a bottom surface of the first portion GE1 of the gate electrode GE. Referring to FIG. 4A, the gate electrode GE may be provided on a top surface, a bottom surface and a sidewall of each of the channel layers CH. In other words, each of transistors of the first and second cell regions PR and NR may be a three-dimensional (3D) field effect transistor in which the gate electrode GE three-dimensionally surrounds each of the channel layers CH.

A first gate spacer GSP1 may cover a sidewall of the first portion GE1 of the gate electrode GE, and a second gate spacer GSP2 may cover a sidewall of the second portion GE2 of the gate electrode GE. The first gate spacer GSP1 may be provided on an uppermost one of the channel layers CH, and the second gate spacer GSP2 may be provided between the channel layers CH and between the substrate 10 and a lowermost one of the channel layers CH.

A gate insulating layer GI may cover and conform to the bottom surface and the sidewall of the first portion GE1 of the gate electrode GE. In other words, the gate insulating layer GI may be between the first portion GE1 of the gate electrode GE and the first gate spacer GSP1 and between the first portion GE1 of the gate electrode GE and the uppermost one of the channel layers CH. In addition, the gate insulating layer GI may cover and conform to a top surface, a bottom surface and a sidewall of the second portion GE2 of the gate electrode GE. In other words, the gate insulating layer GI may be between the second portion GE2 of the gate electrode GE and the second gate spacer GSP2 and between the second portion GE2 of the gate electrode GE and each of the channel layers CH.

Figure 5:
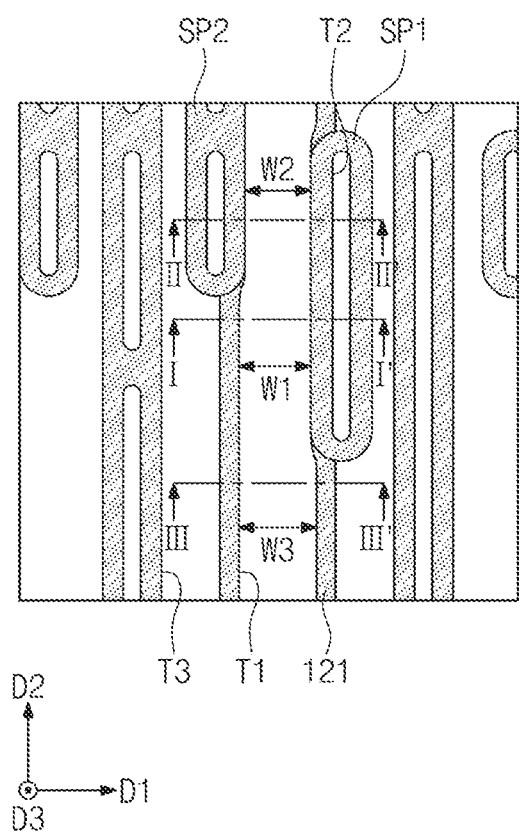
FIG. 5 is a plan view illustrating a method of manufacturing a semiconductor device according to some embodiments of the inventive concepts.

FIG. 5 is a plan view illustrating a method of manufacturing a semiconductor device according to some embodiments of the inventive concepts. FIGS. 6A to 6G are cross-sectional views taken along lines I-I', II-II' and III-III' of FIG. 5 to illustrate a method of manufacturing a semiconductor device according to some embodiments of the inventive concepts.

First, referring to FIGS. 2, 3A, 3B and 3C, a method of manufacturing a semiconductor device according to the inventive concepts may include: forming standard cells SC which include a substrate 10 including first and second active patterns AP1 and AP2, gate structures GS intersecting the first and second active patterns AP1 and AP2 on the substrate 10, first and second active contacts AC1 and AC2 intersecting the first and second active patterns AP1 and AP2 on the substrate 10, and first to third interlayer insulating layers 11, 13 and 15 covering the gate structures GS and the first and second active contacts AC1 and AC2; and forming a first interconnection pattern P1 which extends between the standard cells SC in parallel to the first and second active patterns AP1 and AP2 and is electrically connected to the gate structure GS, the first active contact AC1 or the second active contact AC2. Hereinafter, the formation of the first interconnection pattern P1 in the third interlayer insulating layer 15 will be described in detail.

Figure 6A:
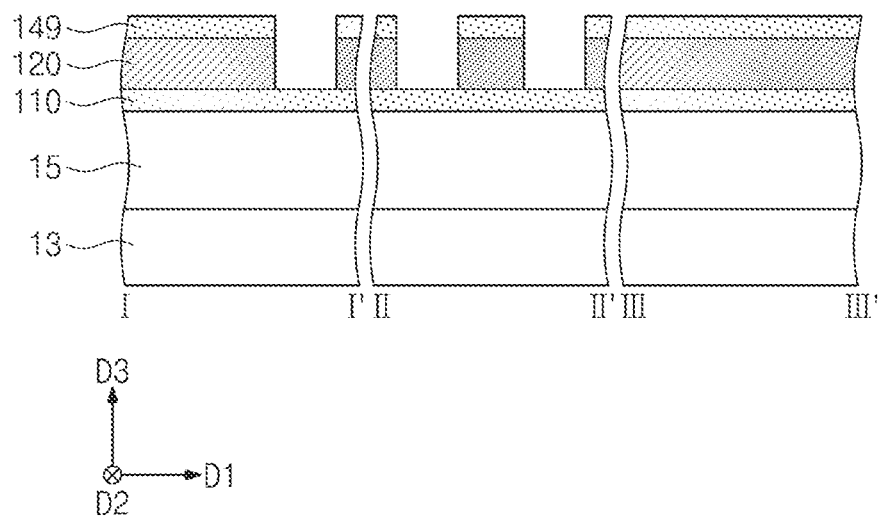
FIGS. 6A to 6G are cross-sectional views taken along lines I-I', II-II' and III-III' of FIG. 5 to illustrate a method of manufacturing a semiconductor device according to some embodiments of the inventive concepts.

Referring to FIG. 6A, the second and third interlayer insulating layers 13 and 15 may be formed on the gate structure GS and the first interlayer insulating layer 11, described with reference to FIGS. 3A to 3C. A first mask layer 110 and a second mask layer 120 may be sequentially stacked on the third interlayer insulating layer 15.

The first mask layer 110 and the second mask layer 120 may be formed of different materials. For example, the first mask layer 110 may be formed of silicon oxide, and the second mask layer 120 may be formed of poly-crystalline silicon or amorphous silicon. However, embodiments of the inventive concepts are not limited thereto. In certain embodiments, the second mask layer 120 may further include hydrogen (H).

In some embodiments, a plurality of mask layers (not shown) may further be formed between the third interlayer insulating layer 15 and the first mask layer 110. The mask layers between the third interlayer insulating layer 15 and the first mask layer 110 may be formed of a different material from that of the first mask layer 110 and may be formed of, for example, a low-k dielectric material and/or titanium nitride.

A first photoresist pattern 149 may be formed on the second mask layer 120. A first etching process may be performed using the first photoresist pattern 149 as an etch mask. The second mask layer 120 may be patterned by the first etching process. Thereafter, the first photoresist pattern 149 may be removed.

Figure 6B:
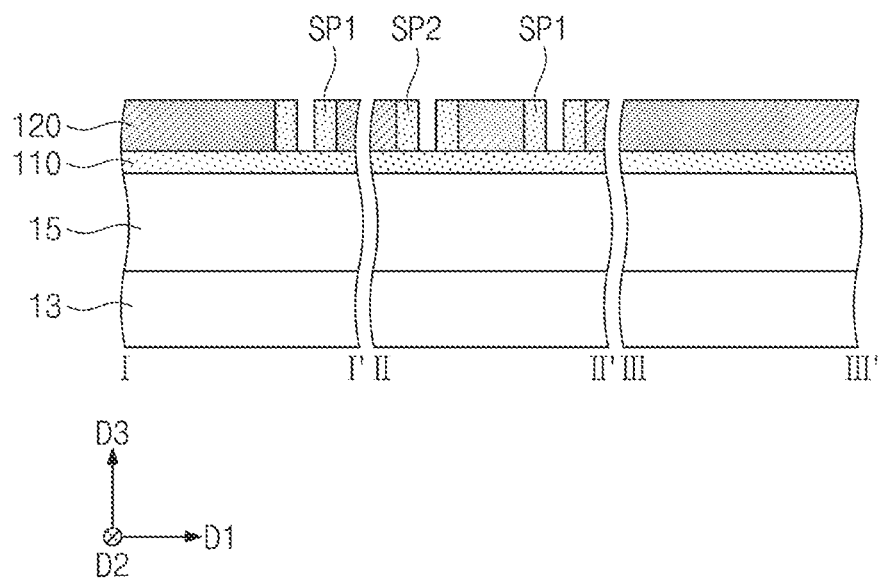

Referring to FIG. 6B, a first spacer SP1 and a second spacer SP2 may be formed on sidewalls of the second mask layer 120. The first spacer SP1 and the second spacer SP2 may be spaced apart from each other in the first direction D1. The second spacer SP2 may overlap with a portion of the first spacer SP1 in the first direction D1. Another portion of the first spacer SP1 may not overlap with the second spacer SP2 in the first direction D1.

Each of the first and second spacers SP1 and SP2 may be formed in a space formed in the first mask layer 120 by the first etching process using the first photoresist pattern 149. The formation of the first and second spacers SP1 and SP2 may include forming a spacer layer covering the second mask layer 120, and etching a portion of the spacer layer until a top surface of the second mask layer 120 and a top surface of the first mask layer 110 are exposed. In some embodiments, and in contrast to FIG. 6B, each of the first and second spacers SP1 and SP2 may have a width which decreases as a height from the first mask layer 110 increases. The first and second spacers SP1 and SP2 may be formed of the same material. For example, the first and second spacers SP1 and SP2 may be formed of titanium oxide, silicon oxide, or silicon nitride. However, embodiments of the inventive concepts are not limited thereto.

Figure 6C:
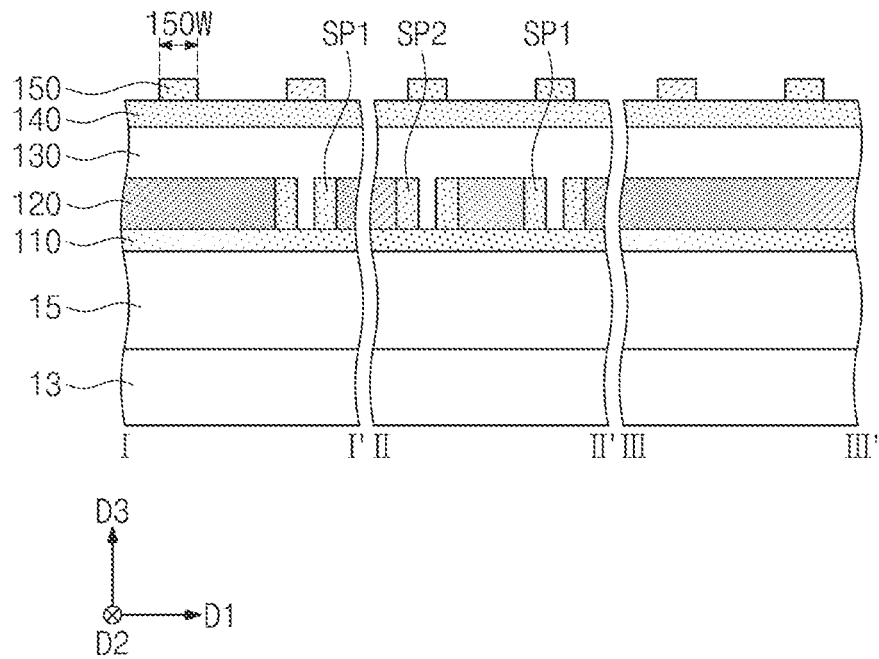

Referring to FIG. 6C, a third mask layer 130 may be formed to cover the second mask layer 120 and the first and second spacers SP1 and SP2. The third mask layer 130 may fill a space surrounded by the first spacer SP1, and a space surrounded by the second spacer SP2. The third mask layer 130 may be formed of a different material from those of the first and second mask layers 110 and 120. For example, the third mask layer 130 may be formed of a spin-on-hardmask (SOH) material including carbon (C), although the embodiments of the inventive concepts are not limited thereto. A fourth mask layer 140 and a second photoresist pattern 150 may be formed on the third mask layer 130. The fourth mask layer 140 may be formed of a different material from that of the third mask layer 130. For example, the fourth mask layer 140 may be formed of silicon oxynitride. However, embodiments of the inventive concepts are not limited thereto.

Figure 6D:
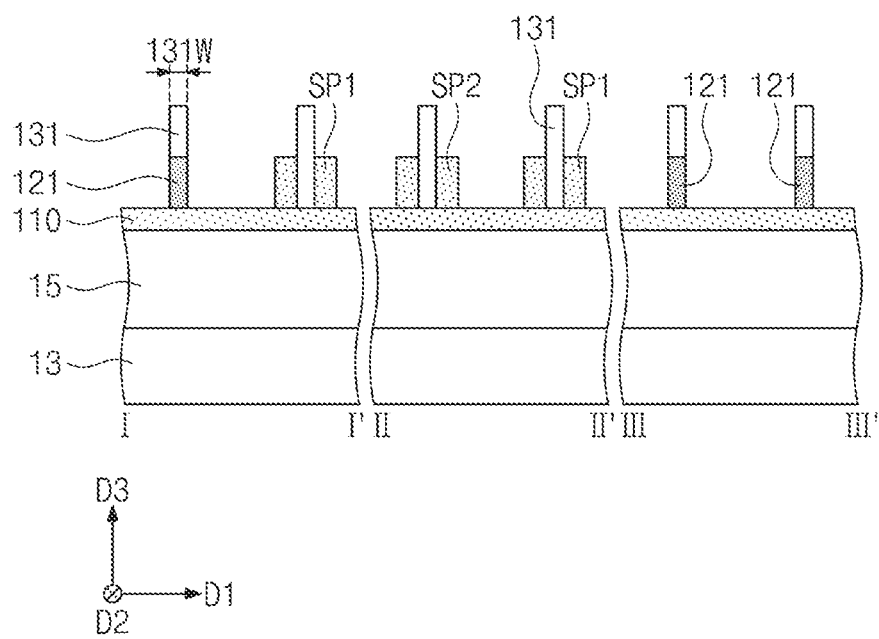

Referring to FIGS. 6C and 6D, a second etching process may be performed using the second photoresist pattern 150 as an etch mask. The fourth mask layer 140, the third mask layer 130 and the second mask layer 120 may be patterned by the second etching process, and thus a second mask pattern 121 and a third mask pattern 131 may be formed. Thereafter, the second photoresist pattern 150 and the patterned fourth mask layer 140 may be removed.

The second etching process may have a high etch selectivity of the second mask layer 120 (or the second mask pattern 121) to the first mask layer 110 and the third mask layer 130. A width 131W of the third mask pattern 131 after the second etching process may be less than a width 150W of the second photoresist pattern 150. A width of the second mask pattern 121 may be substantially equal to the width 131W of the third mask pattern 131. A distance between the first spacer SP1 and the second mask pattern 121 and a distance between the second mask patterns 121 adjacent to each other in the first direction D1 may be determined depending on the etch selectivity of the second etching process.

Figure 6E:
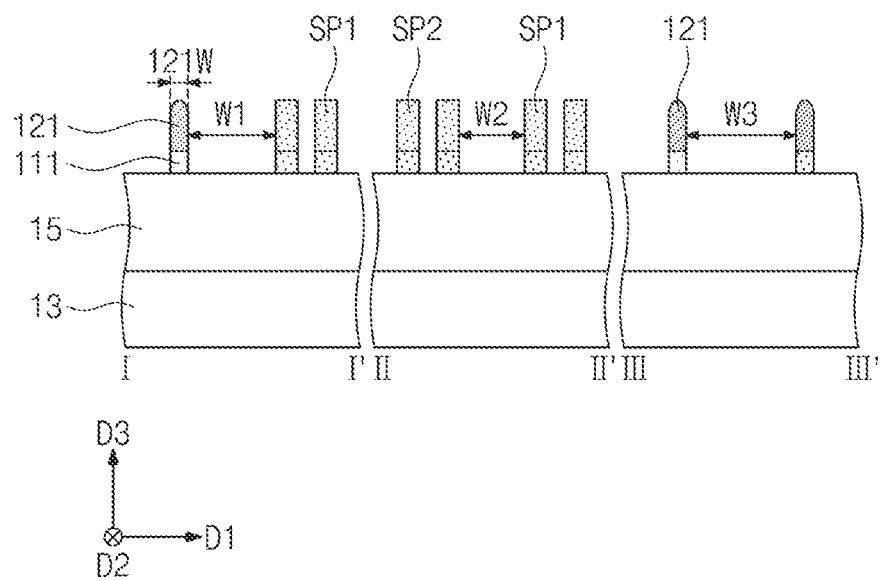

Referring to FIGS. 6D and 6E, a third etching process may be performed using the second mask pattern 121 and the first and second spacers SP1 and SP2 as etch masks. The first mask layer 110 may be patterned by the third etching process, and thus a first mask pattern 111 may be formed. The third mask pattern 131 may be removed by the third etching process. In addition, an upper portion of the second mask pattern 121 may also be partially etched by the third etching process. The first and second spacers SP1 and SP2 on the first mask pattern 111 may remain after the third etching process.

A width of an upper portion of the second mask pattern 121 after the third etching process may decrease as a height from the first mask pattern 111 increases. A maximum width 121W of the second mask pattern 121 after the third etching process may be less than the width 150W of the second photoresist pattern 150 described with reference to FIG. 6C. The maximum width 121W of the second mask pattern 121 after the third etching process may be equal to or less than the width 131W of the third mask pattern 131. A width of the first mask pattern 111 may be substantially equal to the maximum width 121W of the second mask pattern 121.

With reference to FIG. 6E, a distance between the first spacer SP1 and the second mask pattern 121 may be defined as a first width W1, and the first width W1 may be determined depending on the second etching process.

A distance between the first spacer SP1 and the second spacer SP2 may be defined as a second width W2, and the second width W2 may be kept constant or substantially constant regardless of adjustment of the etch selectivity of the second etching process, adjustment of an etch selectivity of the third etching process and/or adjustment of the width 150W of the second photoresist pattern 150. The second width W2 may be less than the first width W1 described above. A difference between the second width W2 and the first width W1 may be determined by the adjustment of the etch selectivity of the second etching process, the adjustment of the etch selectivity of the third etching process and/or the adjustment of the width 150W of the second photoresist pattern 150.

A distance between the second mask patterns 121 (or the first mask patterns 111) adjacent to each other in the first direction D1 may be defined as a third width W3, and the third width W3 may be determined by the adjustment of the etch selectivity of the second etching process, the adjustment of the etch selectivity of the third etching process and/or the adjustment of the width 150W of the second photoresist pattern 150. The third width W3 may be greater than the first width W1 described above. A difference between the third width W3 and the first width W1 may be determined by the adjustment of the etch selectivity of the second etching process, the adjustment of the etch selectivity of the third etching process and/or the adjustment of the width 150W of the second photoresist pattern 150.

Figure 6F:
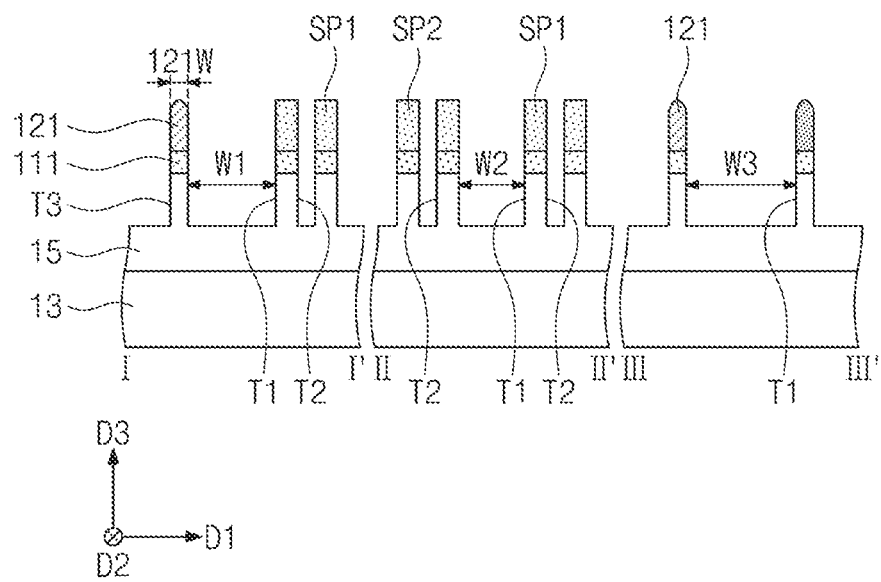

Referring to FIGS. 6E and 6F, a fourth etching process may be performed using the first mask pattern 111 (or the second mask pattern 121 and the first and second spacers SP1 and SP2) as an etch mask. Portions of the third interlayer insulating layer 15 may be etched by the fourth etching process, and thus first to third trenches T1, T2 and T3 may be formed.

Figure 6G:
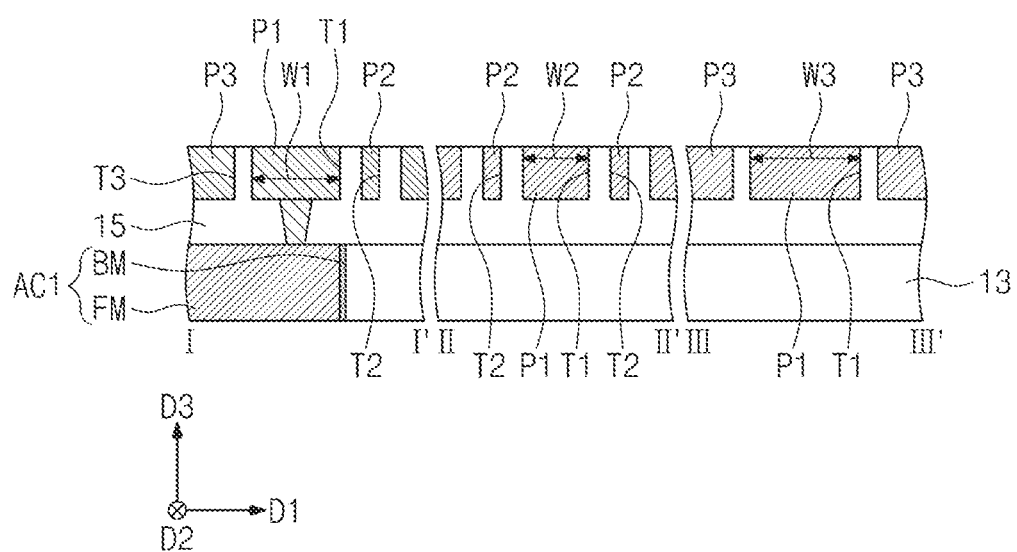

Referring to FIGS. 6F and 6G, first to third interconnection patterns P1, P2 and P3 may be formed to fill the first to third trenches T1, T2 and T3, respectively. The first and second mask patterns 111 and 121 and the first and second spacers SP1 and SP2 may be removed after the fourth etching process.

A width of the first interconnection pattern P1 may be equal to the first width W1, the second width W2 or the third width W3, depending on its position. A width of each of the second and third interconnection patterns P2 and P3 may be less than the first width W1, and however, embodiments of the inventive concepts are not limited thereto.

The formation of the first to third interconnection patterns P1, P2 and P3 may include forming a metal layer filling the first to third trenches T1, T2 and T3, and performing a planarization process on the metal layer until a top surface of the third interlayer insulating layer 15 is exposed. For example, the planarization process may be a chemical mechanical polishing (CMP) process or an etch-back process. Due to the planarization process, the top surface of the third interlayer insulating layer 15 may be substantially coplanar with top surfaces of the first to third interconnection patterns P1, P2 and P3.

Before the formation of the first to third interconnection patterns P1, P2 and P3, a portion of the third interlayer insulating layer 15 may further be etched until a top surface of the first active contact AC1 is exposed, and then, a first via 23 may be formed to fill an etched space. For example, the first via 23 and the first interconnection pattern P1 may be formed in one body through a damascene process.

Referring again to FIGS. 5, 6E and 6F, a width of the first trench T1 in the first direction D1 may be varied or changed depending on a position. In other words, the width of the first trench T1 in the first direction D1 may be changed in stages toward or along the second direction D2.

For example, the first trench T1 may have the first width W1 between the first spacer SP1 and the second mask pattern 121 (e.g., at a place adjacent to the first spacer SP1 and the second mask pattern 121 in the first direction D1). The first spacer SP1 and the second mask pattern 121 may be spaced apart from each other in the first direction D1 with the first trench Ti interposed therebetween, and the first width W1 may be defined as a distance in the first direction D1 between the first spacer SP1 and the second mask pattern 121.

The first trench T1 may have the second width W2 between the first spacer SP1 and the second spacer SP2 (e.g., at a place adjacent to the first spacer SP1 and the second spacer SP2 in the first direction D1). The first spacer SP1 and the second spacer SP2 may be spaced apart from each other in the first direction D1 with the first trench T1 interposed therebetween, and the second width W2 may be defined as a distance in the first direction D1 between the first spacer SP1 and the second spacer SP2.

The first trench T1 may have the third width W3 between the second mask patterns 121 adjacent to each other in the first direction D1. The third width W3 may be defined as a distance between the second mask patterns 121 adjacent to each other in the first direction D1 with the first trench T1 interposed therebetween.

The second width W2 may be less than the first width W1, and the third width W3 may be greater than the first width W1 and the second width W2. For example, the width of the first trench T1 may decrease in stages toward or along the second direction D2. However, embodiments of the inventive concepts are not limited thereto. The width of the first trench T1 may be changed depending on planar positions of the first and second spacers SP1 and SP2.

The width, in the first direction D1, of the first interconnection pattern P1 filling the first trench T1 may also be varied or changed along the length thereof due to the variation or change of the width of the first trench T1 in the first direction D1. In other words, the width of the first interconnection pattern P1 in the first direction D1 may be changed in stages toward or along the second direction D2.

As described above, the difference between the first and second widths W1 and W2 and the difference between the first and third widths W1 and W3 may be determined by the adjustment of the etch selectivity of the etching process(es) and/or the adjustment of the width of the photoresist pattern. Thus, a resistance value of the first interconnection pattern P1 filling the first trench T1 may be targeted to a desired value. According to the method of manufacturing a semiconductor device in the embodiments of the inventive concepts, stability and electrical characteristics of the semiconductor device may be improved, and the width of the interconnection pattern may be adjusted without revision of the mask pattern, thereby simplifying processes of manufacturing semiconductor devices.

Figure 7:
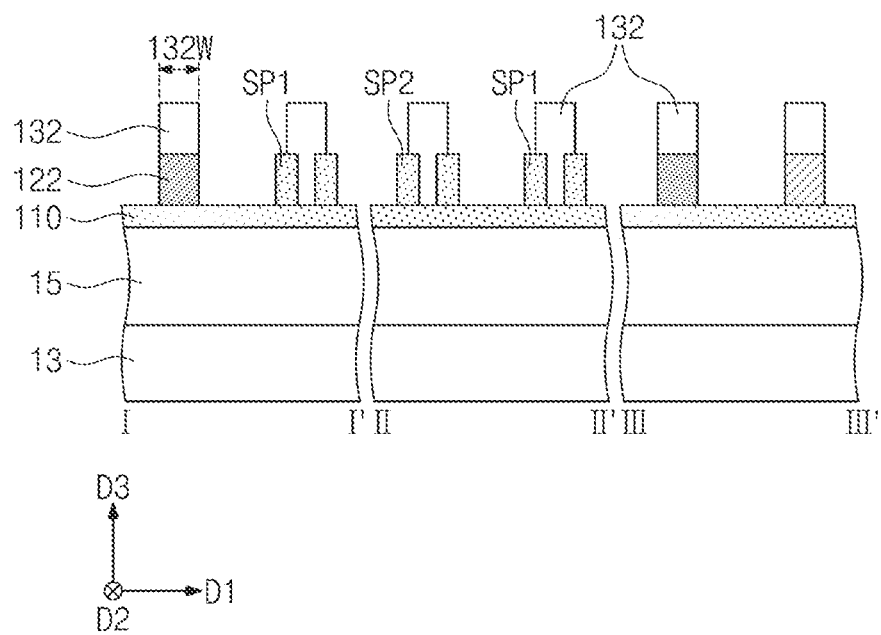
FIGS. 7 and 8 are cross-sectional views taken along the lines I-I', II-II' and III-III' of FIG. 5 to illustrate a method of manufacturing a semiconductor device according to some embodiments of the inventive concepts.

FIG. 7 is a cross-sectional view taken along the lines I-I', II-II' and III-III' of FIG. 5 to illustrate a method of manufacturing a semiconductor device according to some embodiments of the inventive concepts.

Referring to FIGS. 6C and 7, a second etching process may be performed using the second photoresist pattern 150 as an etch mask. Processes before the second etching process may be substantially the same as described with reference to FIGS. 6A to 6C.

The fourth mask layer 140, the third mask layer 130 and the second mask layer 120 may be patterned by the second etching process, and thus a second mask pattern 122 and a third mask pattern 132 may be formed. At this time, a portion of each of the second and third mask layers 120 and 130, which vertically overlaps with the second photoresist pattern 150, may not be etched. Thereafter, the second photoresist pattern 150 and the patterned fourth mask layer 140 may be removed.

A width 132W of the third mask pattern 132 after the second etching process may be equal to or less than the width 150W of the second photoresist pattern 150. A width of the second mask pattern 122 may be substantially equal to the width 132W of the third mask pattern 132.

Referring to FIGS. 7 and 6E, a third etching process may be performed using the third mask pattern 132 as an etch mask. The first mask layer 110 may be patterned by the third etching process, and thus a first mask pattern 111 may be formed. Thereafter, the third mask pattern 132 may be removed. In addition, an upper portion of the second mask pattern 122 may also be partially etched by the third etching process.

The third etching process may have a high etch selectivity of the first mask layer 110 (or the first mask pattern 111) to the second mask pattern 122 and the third mask pattern 132. A width 121W of the second mask pattern 121 after the third etching process may be less than the width 132W of the third mask pattern 132 and the width 150W of the second photoresist pattern 150 described with reference to FIG. 6C. A width of the first mask pattern 111 after the third etching process may be substantially equal to the width 121W of the second mask pattern 121. A distance between the first spacer SP1 and the second mask pattern 121 and a distance between the second mask patterns 121 adjacent to each other in the first direction D1 may be determined depending on the etch selectivity of the third etching process.

Processes after the third etching process may be substantially the same as described with reference to FIGS. 6E and 6F.

Figure 8:
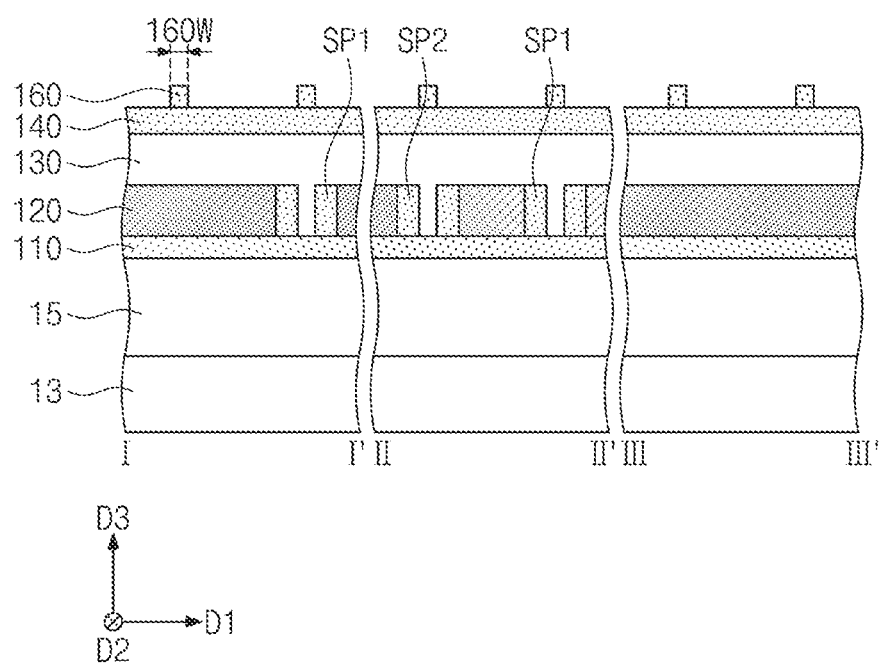

FIG. 8 is a cross-sectional view taken along the lines I-I', II-II' and III-III' of FIG. 5 to illustrate a method of manufacturing a semiconductor device according to some embodiments of the inventive concepts.

Referring to FIGS. 6B and 8, a third mask layer 130 may be formed to cover the second mask layer 120 and the first and second spacers SP1 and SP2, a fourth mask layer 140 may be formed on the third mask layer 130, and a third photoresist pattern 160 may be formed on the fourth mask layer 140. A width 160W of the third photoresist pattern 160 may be less than the width 150W of the second photoresist pattern 150 described with reference to FIG. 6C.

Referring to FIGS. 8 and 6D, a second etching process may be performed using the third photoresist pattern 160 as an etch mask. The fourth mask layer 140, the third mask layer 130 and the second mask layer 120 may be patterned by the second etching process. At this time, a portion of each of the second and third mask layers 120 and 130, which vertically overlaps with the third photoresist pattern 160, may not be etched.

Referring to FIG. 6E, a third etching process may be performed using the portions of the second and third mask layers 120 and 130, which are not etched in the second etching process but remain, as etch masks. The first mask layer 110 may be patterned by the third etching process. At this time, a portion of the first mask layer 110, which vertically overlaps with the portion of each of the second and third mask layers 120 and 130, may not be etched. Referring to FIGS. 8 and 6E, a distance between the first spacer SP1 and the second mask pattern 121 and a distance between the second mask patterns 121 adjacent to each other in the first direction D1 may be determined depending on the width 160W of the third photoresist pattern 160.

Processes after the third etching process may be substantially the same as described with reference to FIGS. 6E and 6F.

In the method of manufacturing a semiconductor device according to the embodiments of the inventive concepts, the resistance value of the interconnection pattern may be targeted by adjusting the width of the interconnection pattern, thereby improving the stability and electrical characteristics of the semiconductor device.

Additionally, in the method of manufacturing a semiconductor device according to the embodiments of the inventive concepts, the width of the interconnection pattern may be adjusted without revision of the mask pattern, and thus processes of manufacturing semiconductor devices may be simplified.

While the inventive concepts have been described with reference to example embodiments, it will be apparent to those skilled in the art that various changes and modifications may be made without departing from the scope of the present disclosure. Therefore, it should be understood that the above embodiments are not limiting, but illustrative. Thus, the scope of the present disclosure is to be determined by the broadest permissible interpretation of the following claims and equivalents thereof, and shall not be restricted or limited by the foregoing description.

What is claimed is:

1. A method of manufacturing a semiconductor device, the method comprising:
   forming an interlayer insulating layer on a substrate;
   forming a first mask layer on the interlayer insulating layer;
   forming a second mask layer on the first mask layer and a first spacer that covers a first sidewall of the second mask layer;
   forming a photoresist pattern on the second mask layer;
   forming a second mask pattern by patterning the second mask layer through a first etching process that uses the photoresist pattern as an etch mask;
   forming a first mask pattern by patterning the first mask layer through a second etching process that uses the second mask pattern and the first spacer as etch masks;
   forming a trench by etching a portion of the interlayer insulating layer through a third etching process that uses the first mask pattern as an etch mask; and
   forming an interconnection pattern within the trench,
   wherein a width of the first mask pattern after the second etching process is less than a width of the photoresist pattern.

2. The method of claim 1, further comprising:
   forming, concurrently with the forming of the first spacer, a second spacer that covers a second sidewall of the second mask layer,
   wherein, subsequent to forming the trench, the second spacer is spaced apart from the first spacer in a horizontal direction with the trench interposed therebetween.

3. The method of claim 2, wherein the second spacer overlaps with a portion of the first spacer in the horizontal direction.

4. The method of claim 2, wherein a second width defined as a distance between the first spacer and the second spacer is less than a first width defined as a distance between the second mask pattern and the first spacer.

5. The method of claim 4, wherein a difference between the second width and the first width is selected based on an etch selectivity of the first etching process to the second mask layer or an etch selectivity of the second etching process to the first mask layer.

6. The method of claim 4, wherein a plurality of second mask patterns are formed, and wherein a third width defined as a distance between two second mask patterns adjacent to each other in the horizontal direction with the trench interposed therebetween is greater than the first width.

7. The method of claim 6, wherein a difference between the third width and the first width is selected based on an etch selectivity of the first etching process to the second mask layer or an etch selectivity of the second etching process to the first mask layer.

8. The method of claim 4, wherein the first width is selected based on the first etching process having a high etch selectivity of the second mask layer relative to the first mask layer.

9. The method of claim 4, wherein the first width is selected based on the second etching process having a high etch selectivity of the first mask layer relative to the second mask layer.

10. The method of claim 4, wherein the trench has the first width at a first location adjacent to the first spacer and the second mask pattern in the horizontal direction and has the second width at a second location adjacent to the first spacer and the second spacer in the horizontal direction.

11. The method of claim 1, wherein the trench is a first trench of a plurality of trenches formed concurrently, and the interconnection pattern is a first interconnection pattern of a plurality of interconnection patterns formed concurrently, and
   wherein the plurality of interconnection patterns are respectively within the plurality of trenches and have different widths from each other.

12. The method of claim 1, wherein a width of the second mask pattern between the first etching process and the second etching process is less than the width of the photoresist pattern.

13. The method of claim 1, wherein a width of the second mask pattern between the first etching process and the second etching process is substantially equal to the width of the photoresist pattern, and
   wherein a width of the second mask pattern after the second etching process is less than the width of the photoresist pattern.

14. The method of claim 1, further comprising:
   forming, after the forming of the second mask layer and the first spacer and before the first etching process, a third mask layer on the second mask layer and the first spacer, wherein the third mask layer at least partially fills a space surrounded by the first spacer.

15. The method of claim 14, wherein the first to third mask layers are formed of different materials from each other.

16. A method of manufacturing a semiconductor device, the method comprising:
 forming an interlayer insulating layer on a substrate;
 forming a mask layer on the interlayer insulating layer and a first spacer that covers a first sidewall of the mask layer;
 forming a photoresist pattern on the mask layer;
 forming a mask pattern by patterning the mask layer through a first etching process that uses the photoresist pattern as an etch mask;
 forming a trench by etching a portion of the interlayer insulating layer through a second etching process that uses the mask pattern and the first spacer as etch masks; and
 forming an interconnection pattern within the trench,
 wherein a first width defined as a distance between the mask pattern and the first spacer is based on a width of the photoresist pattern.

17. The method of claim 16, further comprising:
 forming, concurrently with the forming of the first spacer, a second spacer that covers a second sidewall of the mask layer,
 wherein, subsequent to forming the trench, the second spacer is spaced apart from the first spacer in a horizontal direction with the trench interposed therebetween,
 wherein the second spacer overlaps with a portion of the first spacer in the horizontal direction, and
 wherein a second width defined as a distance between the first spacer and the second spacer is less than the first width.

18. The method of claim 16, wherein a plurality of mask patterns are formed, and wherein a third width defined as a distance between two mask patterns adjacent to each other in a horizontal direction with the trench interposed therebetween is greater than the first width.

19. A method of manufacturing a semiconductor device, the method comprising:
 forming standard cells which comprise: a substrate comprising active patterns that extend in a first direction; gate structures and active contacts that intersect the active patterns on the substrate; and an interlayer insulating layer that covers the gate structures and the active contacts; and
 forming an interconnection pattern that extends in the first direction between the standard cells and is electrically connected to the gate structure or the active contact,
 wherein the forming of the interconnection pattern comprises:
 forming a first mask layer on the interlayer insulating layer;
 forming a second mask layer on the first mask layer and a first spacer that covers a first sidewall of the second mask layer;
 forming a photoresist pattern on the second mask layer;
 forming a second mask pattern by patterning the second mask layer through a first etching process that uses the photoresist pattern as an etch mask;
 forming a first mask pattern by patterning the first mask layer through a second etching process that uses the second mask pattern and the first spacer as etch masks;
 forming a trench by etching a portion of the interlayer insulating layer through a third etching process that uses the first mask pattern as an etch mask;
 forming a metal layer within the trench; and
 performing a planarization process on the metal layer until a top surface of the interlayer insulating layer is exposed,
 wherein a width of the first mask pattern after the second etching process is less than a width of the photoresist pattern.

20. The method of claim 19, wherein each of the active patterns comprises a plurality of stacked channel layers, and wherein each of the gate structures surrounds a respective plurality of the stacked channel layers.

* * * * *